(12) United States Patent
Stevenson et al.

(10) Patent No.: US 8,313,665 B2
(45) Date of Patent: *Nov. 20, 2012

(54) SHOWERHEAD ELECTRODE ASSEMBLIES FOR PLASMA PROCESSING APPARATUSES

(75) Inventors: Thomas R. Stevenson, Gilroy, CA (US); Anthony de la Llera, Fremont, CA (US); Saurabh Ullal, South San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 12/954,017

(22) Filed: Nov. 24, 2010

(65) Prior Publication Data
US 2011/0081783 A1 Apr. 7, 2011

Related U.S. Application Data

(62) Division of application No. 11/896,375, filed on Aug. 31, 2007, now Pat. No. 7,862,682.

(60) Provisional application No. 60/929,107, filed on Jun. 13, 2007.

(51) Int. Cl.
*G01L 21/30* (2006.01)
*H01L 21/302* (2006.01)

(52) U.S. Cl. .................. 216/59; 216/67; 438/9; 438/14; 438/710; 156/345.34

(58) Field of Classification Search .................... 216/59, 216/67; 438/9, 14, 710; 156/345.34
See application file for complete search history.

(56) References Cited

U.S. PATENT DOCUMENTS

| | | | |
|---|---|---|---|
| 4,598,249 A | 7/1986 | Goodman et al. | |
| 6,092,811 A | 7/2000 | Bojarczuk et al. | |
| 6,120,608 A | 9/2000 | Shendon et al. | |
| 6,412,437 B1 | 7/2002 | Campbell et al. | |
| 7,270,713 B2 | 9/2007 | Blonigan et al. | |
| 7,381,291 B2 | 6/2008 | Tobe et al. | |
| 7,430,986 B2 | 10/2008 | Dhindsa et al. | |
| 7,645,341 B2 | 1/2010 | Kennedy et al. | |
| 7,862,682 B2 * | 1/2011 | Stevenson et al. | 156/345.34 |
| 2003/0185729 A1 | 10/2003 | Ko et al. | |
| 2005/0241766 A1 | 11/2005 | Dhindsa et al. | |
| 2007/0068629 A1 | 3/2007 | Shih et al. | |
| 2008/0308229 A1 | 12/2008 | Patrick et al. | |
| 2009/0305509 A1 * | 12/2009 | Stevenson et al. | 438/710 |

FOREIGN PATENT DOCUMENTS
JP H09-027398 A 1/1997

OTHER PUBLICATIONS

The Bergquist Company, Thermal Materials: Sil-Pad Products, http://www.bergquistcompany.com/tm_sil_pad-print.cfm?oid=104284, Jun. 13, 2007.

(Continued)

*Primary Examiner* — Shamim Ahmed
(74) *Attorney, Agent, or Firm* — Buchanan Ingersoll & Rooney PC

(57) ABSTRACT

Showerhead electrode assemblies are disclosed, which include a showerhead electrode adapted to be mounted in an interior of a vacuum chamber; an optional backing plate attached to the showerhead electrode; a thermal control plate attached to the backing plate or to the showerhead electrode at multiple contact points across the backing plate; and at least one thermally and electrically conductive gasket separating the backing plate and the thermal control plate, or the backing plate and showerhead electrode, at the contact points. Methods of processing semiconductor substrates using the showerhead electrode assemblies are also disclosed.

11 Claims, 14 Drawing Sheets

OTHER PUBLICATIONS

Glasgow, S.D. et al., Performance Testing of Thermal Interface Filler Materials in a Bolted Aluminum Interface Under Thermal/Vacuum Conditions, NASA/TM-2003-212500, Jun. 2003.

International Search Report and Written Opinion mailed Nov. 26, 2008 for PCT/US2008/007089.

Official Action mailed Jun. 25, 2012 for Japanese Appln. No. 2010-512154 (partial translation attached).

* cited by examiner

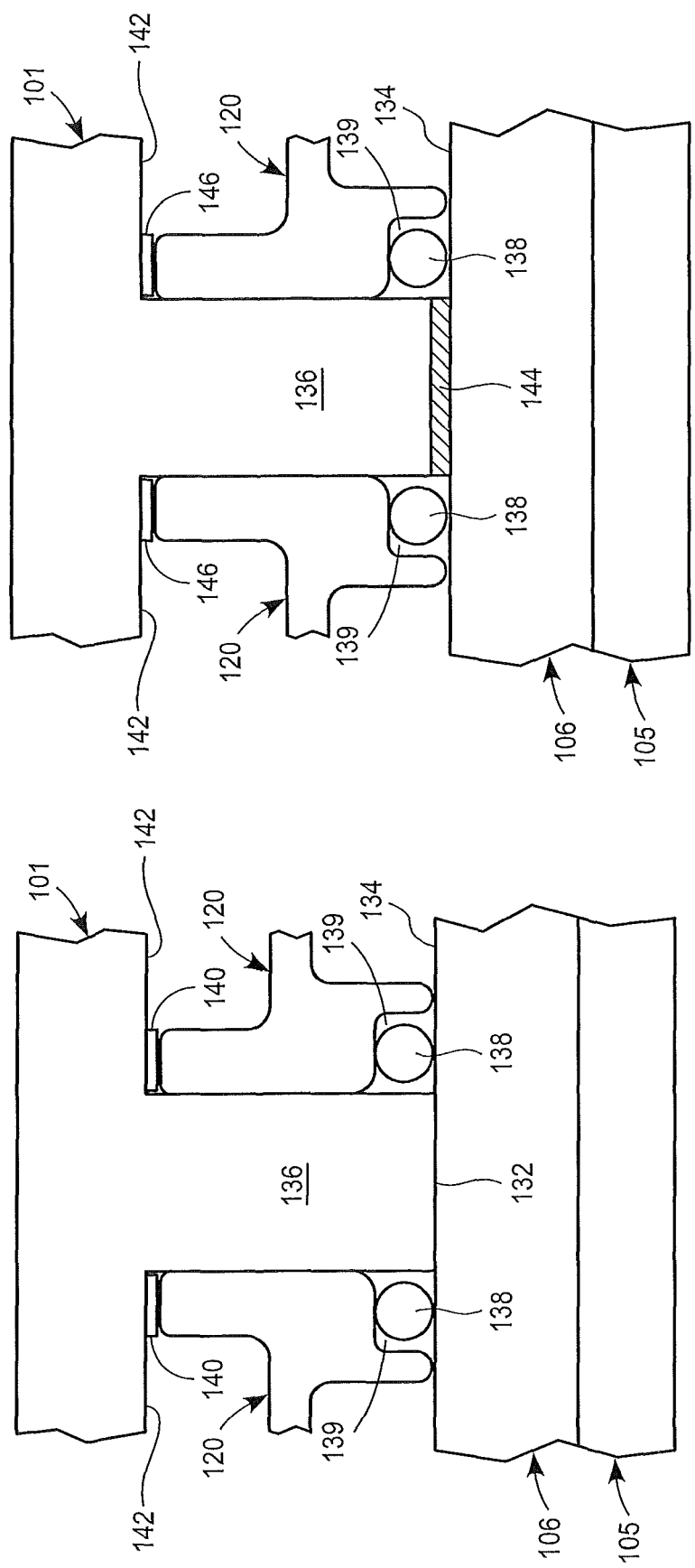

Mean : 1171 Å/min
3-sigma : 104 Å/min (8.8%)
Range : 96 Å/min (8.2%)

Mean : 1008 Å/min
3-sigma : 254 Å/min (25.2%)
Range : 210 Å/min (20.8%)

Mean : 977 Å/min
3-sigma : 203 Å/min (20.8 %)
Range : 175 Å/min (17.9 %)

SHOWERHEAD ELECTRODE ASSEMBLIES FOR PLASMA PROCESSING APPARATUSES

This application is a divisional of U.S. patent application Ser. No. 11/896,375, now U.S. Pat. No. 7,862, 682, entitled SHOWERHEAD ELECTRODE ASSEMBLIES FOR PLASMA PROCESSING APPARATUSES, issued on Jan. 4, 2011, which claims priority to U.S. Provisional Application Ser. No. 60/929,107, filed Jun. 13, 2007, the entire content of each is hereby incorporated by reference.

BACKGROUND

In the field of semiconductor material processing, for example, semiconductor material processing apparatuses including vacuum processing chambers are used performing various processes, such as etching and deposition of various materials on substrates, and resist stripping. As semiconductor technology evolves, decreasing transistor sizes call for an ever higher degree of accuracy, repeatability and cleanliness in wafer processes and process equipment. Various types of equipment exist for semiconductor processing, including applications that involve the use of plasmas, such as plasma etch, plasma-enhanced chemical vapor deposition (PECVD) and resist strip. The types of equipment required for these processes include components which are disposed within the plasma chamber, and must function in that environment. The environment inside the plasma chamber may include exposure to the plasma, exposure to etchant gasses, and thermal cycling. Materials used for such components must be adapted to withstand the environmental conditions in the chamber, and do so for the processing of many wafers which may include multiple process steps per wafer. To be cost effective, such components must often withstand hundreds or thousands of wafer cycles while retaining their functionality and cleanliness. There is generally extremely low tolerance for components which produce particles, even when those particles are few and no larger than a few tens of nanometers. It is also necessary for components selected for use inside plasma processing chambers to meet these requirements in the most cost-effective manner.

SUMMARY

An exemplary embodiment of a showerhead electrode assembly comprises a showerhead electrode adapted to be mounted in an interior of a vacuum chamber and powered by radio frequency (RF) energy; a backing plate attached to the showerhead electrode; a thermal control plate attached to the backing plate via a plurality of fasteners at multiple contact points across the backing plate; and at least one thermally and electrically conductive gasket separating the backing plate and the thermal control plate at the contact points.

An exemplary embodiment of a method of controlling plasma etching comprises supplying process gas to the plasma etching chamber through the showerhead electrode assembly, the process gas flowing into a gap between the showerhead electrode and a bottom electrode on which a semiconductor substrate is supported; and etching a semiconductor substrate in the plasma etching chamber by applying RF power to the showerhead electrode and energizing the process gas into a plasma state, wherein the temperature of the showerhead electrode is controlled by the thermal control plate via enhanced thermal conduction through the at least one thermally and electrically conductive gasket. In the method, the above-described exemplary embodiment of the showerhead electrode assembly can be used.

Another exemplary embodiment of a showerhead electrode assembly comprises a showerhead electrode adapted to be mounted in an interior of a vacuum chamber; a thermal control plate attached to the showerhead electrode at multiple contact points across the showerhead electrode; and at least one thermally and electrically conductive gasket separating the showerhead electrode and the thermal control plate, and separating adjacent plenums formed in the thermal control plate, at the contact points.

DRAWINGS

FIG. 2 is an enlarged view of a portion of the showerhead electrode assembly shown in FIG. 1.

FIG. 3 illustrates the portion of the showerhead electrode assembly shown in FIG. 2 including an interface gasket.

DETAILED DESCRIPTION

Plasma processing apparatuses for semiconductor substrates, such as silicon wafers, include plasma etch chambers which are used in semiconductor device manufacturing processes to etch such materials as semiconductors, metals and dielectrics. For example, a dielectric etch chamber might be used to etch materials such as silicon dioxide or silicon nitride. During the etch process, components within the etch chamber heat up and cool down and experience thermal stresses as a result. For actively heated components of a heated showerhead assembly, this temperature cycling can result in increased particle generation.

A showerhead electrode assembly having a heater to prevent the showerhead electrode from falling below a minimum temperature is described in commonly-owned U.S. Patent Publication No. 2005/0133160A1, the disclosure of which is hereby incorporated by reference in its entirety. The heater cooperates with a thermal control plate in heat transfer with a temperature controlled top plate which forms a top wall of a plasma etch chamber.

Figure 1:
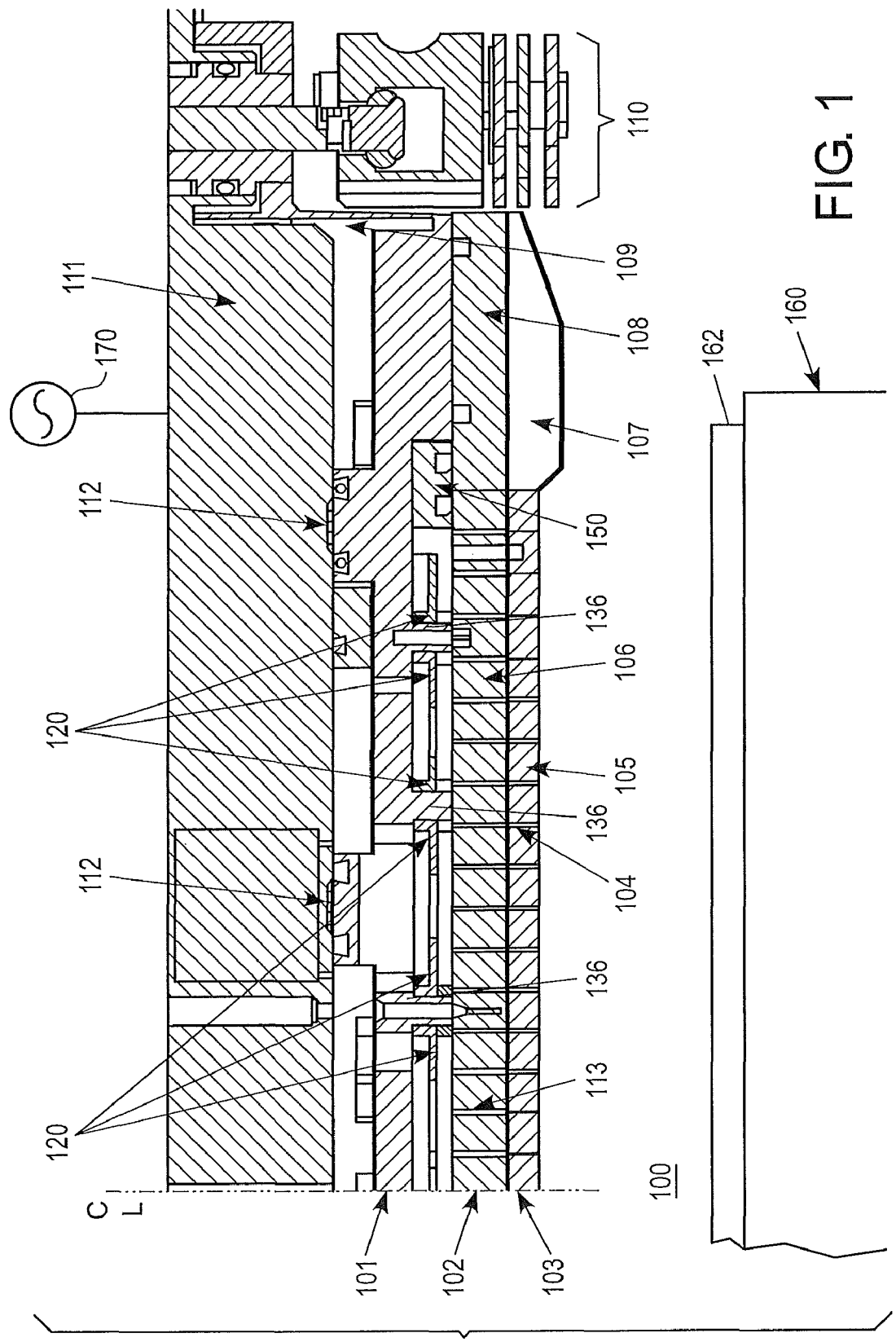
FIG. 1 illustrates an exemplary embodiment of a showerhead electrode assembly of a semiconductor material plasma processing apparatus.

FIG. 1 depicts one-half of a showerhead assembly 100 of a parallel plate capacitively-coupled plasma chamber (vacuum chamber) comprising a top electrode 103 and an optional backing member 102 secured to the top electrode 103, a thermal control plate 101, and a top plate 111. Thermal chokes 112 can be provided on the upper surface of the thermal control plate 101. The top electrode 103 is positioned above a substrate support 160 supporting a semiconductor substrate 162, e.g., semiconductor wafer.

The top plate 111 can form a removable top wall of the plasma processing apparatus, such as a plasma etch chamber. As shown, the top electrode 103 can include an inner electrode member 105, and an optional outer electrode member 107. The inner electrode member 105 is typically made of single crystal silicon. If desired, the inner and outer electrodes 105, 107 can be made of a single piece of material such as CVD silicon carbide, single crystal silicon or other suitable material.

The inner electrode member 105 can have a diameter smaller than, equal to, or larger than a wafer to be processed, e.g., up to 200 mm. For processing larger semiconductor substrates such as 300 mm wafers, the outer electrode member 107 is adapted to expand the diameter of the top electrode 103 from about 12 inches to about 19 inches, such as about 15 inches to about 17 inches. The outer electrode member 107 can be a continuous member (e.g., a poly-silicon or silicon carbide member, such as a ring), or a segmented member (e.g., 2-6 separate segments arranged in a ring configuration, such as segments of single crystal silicon). In embodiments in which the top electrode 103 includes a multiple-segment outer electrode member 107, the segments preferably have edges which overlap each other to protect an underlying bonding material from exposure to plasma. The inner electrode member 105 preferably includes multiple gas passages 104 for injecting a process gas into a space in a plasma reaction chamber below the top electrode 103. The outer electrode 107 preferably forms a raised step at the periphery of the electrode 103. Further details of a stepped electrode can be found in commonly-owned U.S. Pat. No. 6,824,627, the disclosure of which is hereby incorporated by reference.

Single crystal silicon is a preferred material for plasma exposed surfaces of the inner electrode member 105 and the outer electrode member 107. High-purity, single crystal silicon minimizes contamination of substrates during plasma processing as it introduces only a minimal amount of undesirable elements into the reaction chamber, and also wears smoothly during plasma processing, thereby minimizing particles.

The showerhead electrode assembly 100 can be sized for processing large substrates, such as semiconductor wafers having a diameter of 300 mm. For 300 mm wafers, the top electrode 103 is at least 300 mm in diameter. However, the showerhead electrode assembly can be sized to process other wafer sizes or substrates having a non-circular configuration.

The backing member 102 includes a backing plate 106 and optionally a backing ring 108. In such configurations, the inner electrode member 105 is co-extensive with the backing plate 106, and the outer electrode member 107 is co-extensive with the surrounding backing ring 108. However, the backing plate 106 can extend beyond the inner electrode member such that a single backing plate can be used to support the inner electrode member and the segmented outer electrode member or the inner electrode and outer electrode can comprise a single piece of material. The inner electrode member 105 and the outer electrode member 107 are preferably attached to the backing member 102 by a bonding material, such as an elastomeric bonding material. The backing plate 106 includes gas passages 113 aligned with the gas passages 104 in the inner electrode member 105 to provide gas flow into the plasma processing chamber. The gas passages 113 can typically have a diameter of about 0.04 inch, and the gas passages 104 can typically have a diameter of about 0.025 inch.

In the embodiment, the backing plate 106 and backing ring 108 are made of an aluminum material, which is typically an aluminum alloy material. The backing plate 106 and backing ring 108 can be made of bare aluminum, i.e., aluminum that has a surface native oxide (and is not anodized).

The top electrode 103 can be attached to the backing plate 106 and backing ring 108 with a thermally and electrically conductive elastomer bonding material that accommodates thermal stresses, and transfers heat and electrical energy between the top electrode 103 and the backing plate 106 and backing ring 108. Alternatively, the elastomer can be thermally conductive, but not electrically conductive. The use of elastomers for bonding together surfaces of an electrode assembly is described, for example, in commonly-owned U.S. Pat. No. 6,073,577, which is incorporated herein by reference in its entirety.

The backing plate 106 and the backing ring 108 are preferably attached to the thermal control plate 101 with suitable fasteners, which can be threaded bolts, screws, or the like. For example, bolts (not shown) can be inserted in holes in the thermal control plate 101 and screwed into threaded openings in the backing member 102. The thermal control plate 101 is in heat transfer relationship with an actively controlled heater. See, for example, FIGS. 1 and 2 and the description thereof in commonly-owned U.S. Published Application No. 2005/0133160A1, the disclosure of which is hereby incorporated by reference. The thermal control plate 101 includes a flexure portion 109 and is preferably made of a machined metallic material, such as aluminum, an aluminum alloy such as aluminum alloy 6061 or the like. The thermal control plate 101 can be made of bare aluminum, i.e., aluminum that has a surface native oxide (and is not anodized). The top plate 111 is preferably made of aluminum or an aluminum alloy such as aluminum alloy 6061. A plasma confinement assembly 110 is shown outwardly of the showerhead electrode assembly 100. A suitable plasma confinement assembly including a vertically-adjustable, plasma confinement ring assembly is described in commonly-owned U.S. Pat. No. 5,534,751, which is incorporated herein by reference in its entirety.

The thermal control plate preferably includes at least one heater operable to cooperate with the temperature-controlled top plate to control the temperature of the top electrode. For example, in a preferred embodiment, the heater is provided on the upper surface of the thermal control plate and includes a first heater zone surrounded by the first projection, a second heater zone between the first projection and the second projection, and a third heater zone between the second projection and the flexure portion. The number of heater zones can be varied; for example, in other embodiments the heater can include a single heater zone, two heater zones, or more than three heater zones. The heater can alternatively be provided on a bottom surface of the thermal control plate.

The heater preferably comprises a laminate including a resistively heated material disposed between opposed layers of a polymeric material that can withstand the operating temperatures reached by the heater. An exemplary polymeric material that can be used is a polyimide sold under the trademark Kapton®, which is commercially available from E.I. du Pont de Nemours and Company. Alternatively, the heater can be a resistive heater embedded in the thermal control plate (e.g., a heating element in a cast thermal control plate or a heating element located in a channel formed in the thermal control plate). Another embodiment of the heater includes a resistive heating element mounted on the upper and/or lower surface of the thermal control plate. Heating of the thermal control plate can be achieved via conduction and/or radiation.

The heater material can have any suitable pattern that provides for thermally uniform heating of the first heater zone, second heater zone, and third heater zone. For example, the laminate heater can have a regular or non-regular pattern of resistive heating lines such as a zig-zag, serpentine, or concentric pattern. By heating the thermal control plate with the heater, in cooperation with operation of the temperature-controlled top plate, a desirable temperature distribution can be provided across the top electrode during operation of the showerhead electrode assembly.

The heater sections located in the first heater zone, second heater zone, and third heater zone can be secured to the thermal control plate by any suitable technique, e.g., the application of heat and pressure, adhesive, fasteners, or the like.

The top electrode can be electrically grounded, or alternatively can be powered, preferably by a radio-frequency (RF) current source 170. In a preferred embodiment, the top electrode is grounded, and power at one or more frequencies is applied to the bottom electrode to generate plasma in the plasma processing chamber. For example, the bottom electrode can be powered at frequencies of 2 MHz and 27 MHz by two independently controlled radio frequency power sources. After a substrate has been processed (e.g., a semiconductor substrate has been plasma etched), the supply of power to the bottom electrode is shut off to terminate plasma generation. The processed substrate is removed from the plasma processing chamber, and another substrate is placed on the substrate support for plasma processing. In a preferred embodiment, the heater is activated to heat the thermal control plate and, in turn, the top electrode, when power to the bottom electrode is shut off. As a result, the top electrode temperature is preferably prevented from decreasing below a desired minimum temperature. For etching dielectric materials, the top electrode temperature is preferably maintained at approximately a constant temperature such as 150 to 250° C. between successive substrate processing runs so that substrates are processed more uniformly, thereby improving process yields. The power supply preferably is controllable to supply power at a desired level and rate to the heater based on the actual temperature and the desired temperature of the top electrode.

In an exemplary embodiments, the top electrode can be heated to a temperature of at least about 80° C., such as heating and maintaining at least a portion of the showerhead electrode at a temperature of at least 100° C., at least about 150° C., or at least 180° C. The top electrode can be heated before etching of a semiconductor substrate. The etching can comprise etching openings in an oxide layer on the semiconductor substrate, where the openings are defined by a patterned photoresist.

The plasma chamber can also include, for example, a temperature controller; a power supply adapted to supply power to a heater which heats the thermal control plate in thermal response to the temperature controller; a fluid control adapted to supply fluid to a temperature controlled top wall of the chamber in response to the temperature controller; and a temperature sensor arrangement adapted to measure the temperature of one or more portions of the showerhead electrode and supply information to the temperature controller.

The illustrated embodiment of the showerhead electrode assembly also comprises an aluminum baffle ring arrangement 120 used to distribute process gasses In a plasma chamber. The aluminum baffle ring arrangement 120 in FIG. 1 includes six rings made from aluminum or an aluminum alloy, such as 6061 aluminum, which comprises by weight from about 96 to about 98% Al, about 0.8 to about 1.2% Mg, about 0.4 to about 0.8% Si, about 0.15 to 0.4% Cu, about 0.04 to 0.35% Cr, and optionally Fe, Mn, Zn and/or Ti. The baffle rings 120 can have an anodized outer surface. The six concentric L-shaped rings are located within the plenums above the backing member 102 and below the thermal control plate 101. For example, a central plenum can include a single ring, the adjacent plenum can include two rings separated by a ½ to 1 inch gap, the next adjacent plenum can include two rings separated by a ½ to 1 inch gap and an outer plenum can include a single ring. The rings are mounted to the thermal control plate 101 with screws. For example, each ring can include circumferentially spaced apart stand-offs or bosses with through holes for receiving the screws, e.g., three bosses arranged apart can be used. Each ring can have a horizontal section of about 0.040 inch thickness and a vertical flange of about ¼ inch in length.

FIG. 2 illustrates a portion of the showerhead electrode assembly 100. As shown, there is a contact point 132 between the top surface 134 of the aluminum backing plate 102 and an annular projection 136 of the thermal control plate 101. In the thermal control plate 101, the contact points 132 cover about 1% to about 30% of the surface area of the backing plate 102. Seals 138, such as O-rings, are disposed in offsets 139 between the aluminum baffle rings 120 and the top surface 134 to form a gas-tight seal. As shown, the upper ends of the vertical walls of the baffle rings 120 are separated from the bottom surface 142 of the thermal control plate 101 by shims 140. The shims 140 are typically made of a dielectric material, such as Kapton®.

The inventors have determined that during operation of the showerhead electrode assembly 100, galling can occur between the thermal control plate 101 and the aluminum backing member 102 including the backing plate 106 and backing ring 108 along contact points located between them. This galling can occur on both of the thermal control plate 101 and aluminum backing member 102, and is caused by relative motion and rubbing occurring between the opposed surfaces of the thermal control plate 101 and aluminum backing member 102 as a result of temperature cycling. This galling is highly undesirable for a number of reasons. First, galling can cause a reduction in thermal transfer and thus a shift in the temperature of the top electrode 103 including the illustrated inner electrode member 105. This temperature shift can cause a process shift during processing of semiconductor substrates in the plasma processing chamber.

Galling of the thermal control plate 101 and aluminum backing member 102 can also cause particle generation, or cause fusing of the thermal control plate 101 and aluminum backing member 102, which then requires excessive force to separate these components, which can result in damage to these components.

Galling of the thermal control plate 101 and aluminum backing member 102 can also increase the difficulty of cleaning the top electrode 103.

Additionally, galling of the thermal control plate 101 and aluminum backing member 102 degrades the cosmetic appearance of these components and reduces their lifetime.

Figure 4:
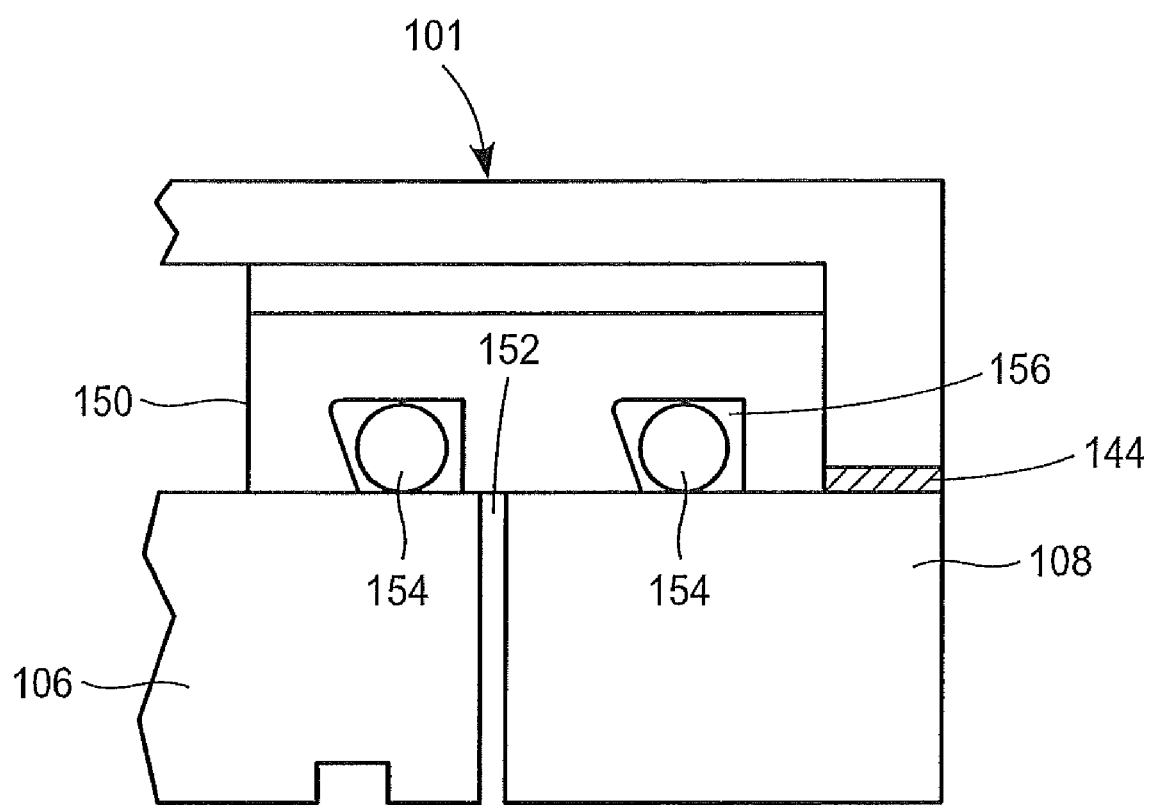
FIG. 4 is an enlarged view of another portion of the showerhead electrode assembly shown in FIG. 1 including an interface gasket.

FIGS. 3 and 4 illustrate an exemplary embodiment of the showerhead electrode assembly including modifications that reduce the occurrence of galling of the thermal control plate 101 and aluminum backing plate 106 and backing ring 108 and consequently also reduce the above-described problems associated with such galling. Particularly, as shown in FIG. 3, a gasket 144 is located between the bottom surface of the annular projection 136 of the thermal control plate and the top surface 134 of the aluminum backing plate 102. The gasket 144 is made of a material that is electrically conductive (to provide an RF path to the electrode) and thermally conductive to provide electrical and thermal conduction between the thermal control plate 101 and the aluminum backing plate 106. The gasket 144 provides an electrically-conductive thermal interface. The gasket 144 also enhances heat transfer between the top electrode 103 including the inner electrode member 105 and the thermal control plate 101. As also shown in FIG. 3, shims 146 having about the same thickness as the gasket 144 are located between the aluminum baffle rings 120 and the bottom surface 142 of the thermal control plate 101. The shims 146 can be of a dielectric material.

The thermal control plate 101 includes several annular projections 136 establishing plenums at the backside of the backing plate 106, e.g., 2 to 10, preferably 4 to 8 projections. An annular gasket 144 is arranged over the contact surfaces of each annular projection. A plurality of fasteners (such as 3 to 15 bolts) pass through openings in each of the annular gaskets to secure the thermal control plate to the backing plate.

FIG. 4 depicts a portion of the backing plate 106 and backing ring 108. As shown, a ring 150 (e.g., a quartz ring) is positioned at an interface 152 between the backing plate 106 and backing ring 108. A seal 154, such as an O-ring, is provided in a groove 156 formed in the ring 150 to form a seal at the interface 152. A shim 144 made of an electrically and thermally conductive material is provided between the thermal control plate 101 and the aluminum backing ring 108. The shim 144 can maintain a seal between the inner electrode member 105 and the outer electrode member 107, and to prevent particle generation by the ring 150.

By enhancing thermal transfer through the contact points, it is possible to reduce temperature differences between the top electrode 103 including the inner electrode member 105 and the thermal control plate 101, such that "first wafer effects" can also be reduced during consecutive processing of a series of wafers. Preferably, first wafer effects can be reduced to less than about 0.5° C. For example, an approximately 1 Å (approximately 0.1 nm) repeatability with critical dimension (CD) sensitivity of about 2 nm/10° C. for etching high aspect ratio contact vias in semiconductor substrates preferably can be achieved.

In addition, the gaskets 144 preferably can also minimize temperature shifts between new and used aluminum backing members to less than about 5° C.

Preferably, the gaskets 144 can also reduce or prevent fusing or galling of the thermal control plate 101 and aluminum backing member 102, which allows these components to be separated from each other with minimum force.

Preferably, the gaskets 144 are made of a material that preferably: does not outgas in a high-vacuum environment of, e.g., about 10 to about 200 mTorr; has low particulate generation performance; is compliant to accommodate shear at contact points; is free of metallic components that are lifetime killers in semiconductor substrates, such as Ag, Ni, Cu and the like; and can minimize the generation of particles during cleaning of the aluminum backing member 102.

The gaskets 144 can be, for example, a conductive silicone-aluminum foil sandwich gasket structure, or a elastomer-stainless steel sandwich gasket structure. In a preferred embodiment, the gaskets 144 are Bergquist Q-Pad II composite materials available from The Bergquist Company, located in Chanhassen, Minn. These materials comprise aluminum coated on both sides with thermally/electrically conductive rubber. The materials are compatible in vacuum environments. The contact surfaces of the thermal control plate and aluminum backing member, e.g., backing plate, each have some degree of roughness caused by processing, e.g., machining. The gasket material is preferably also sufficiently compliant so that it compensates for surface roughness of the contact surface and effectively fills regions (e.g., microvoids) of the contact surfaces to enhance thermal contact between the contact surfaces.

To minimize graphite generation from the gasket material, the gaskets can be cleaned using deionized water, such as by wiping. The gasket material can alternatively be coated with a suitable coating material, such as a fluoroelastomer material.

Figure 5:
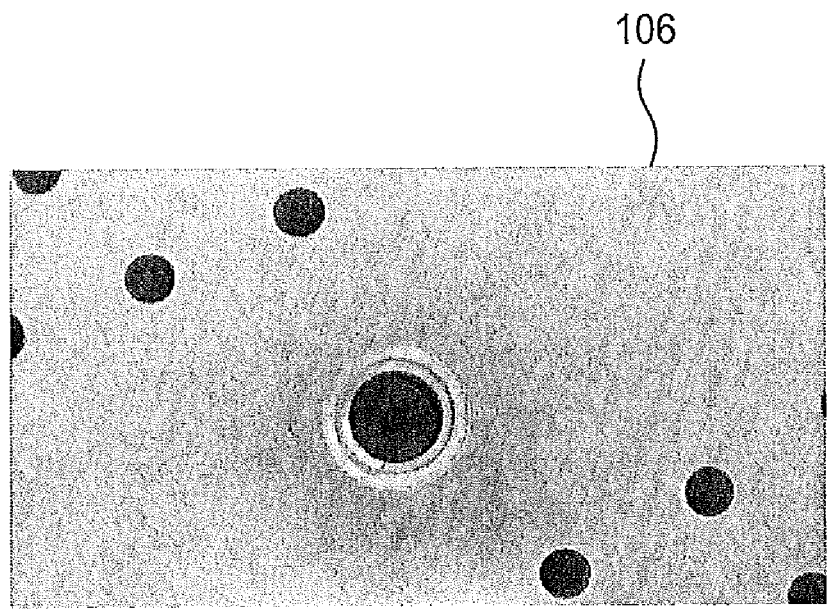
FIG. 5 shows a top surface of an aluminum backing plate and FIG. 6 shows a bottom surface of an annular projection of a thermal control plate after using these components in a vacuum processing chamber with a gasket material between these surfaces.
Figure 6:
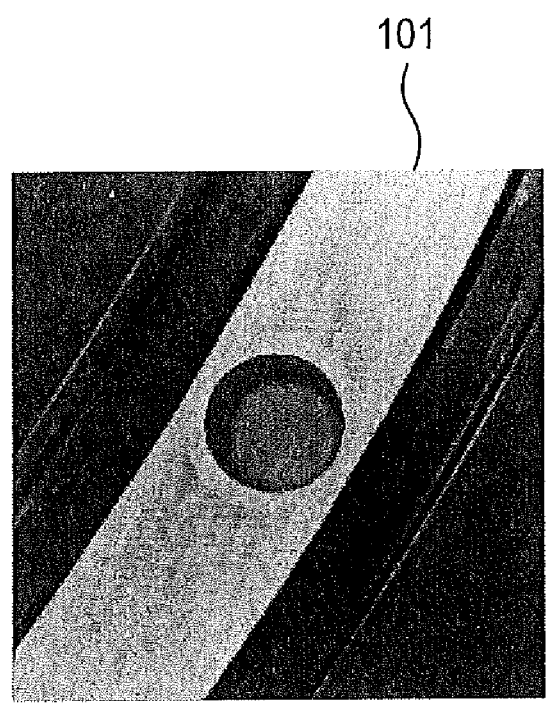

FIG. 5 shows a top surface of an aluminum backing plate 106 and FIG. 6 shows a bottom surface of an annular projection of a thermal control plate 101 after using these components in a vacuum processing chamber with a Q-Pad II gasket material between these surfaces (at contact points). As shown, the top surface of the aluminum backing plate 106 and the bottom surface of the annular projection are free of galling marks. The tests were conducted at a temperature of 170° C. with 5 KW RF power for etching high aspect ratio contact openings. The photographs shown in FIGS. 5 and 6 were taken after 12 RF hours of chamber operation.

Figure 7:
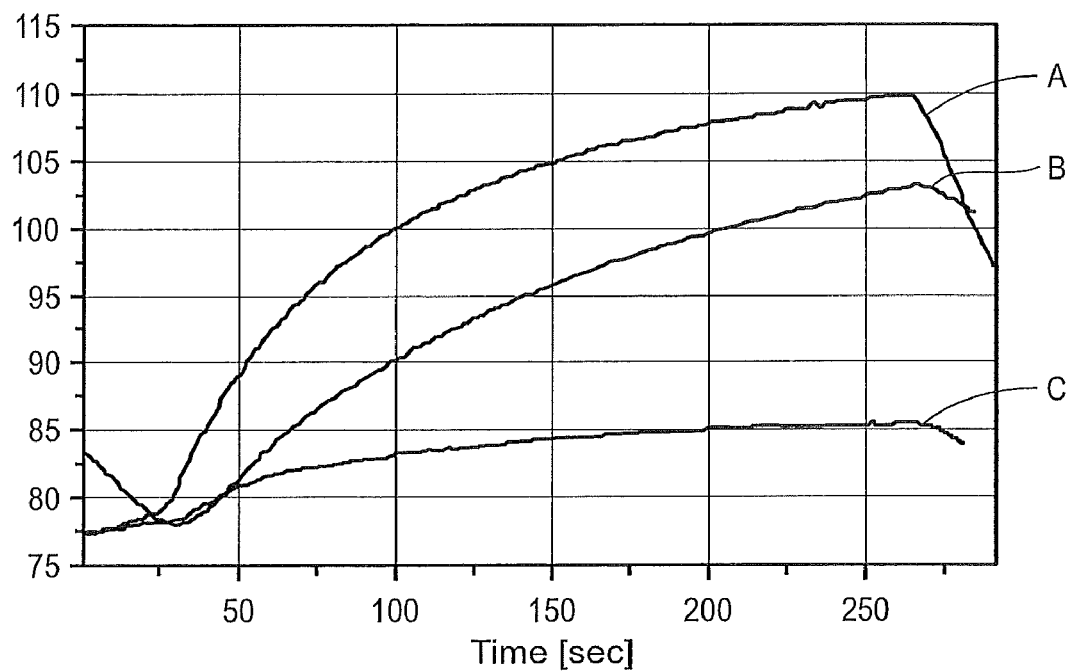
FIGS. 7 and 8 show the relationship between backing plate temperature and time for processing where no gaskets and a gasket material was used between the thermal control plate and backing plate.
Figure 8:
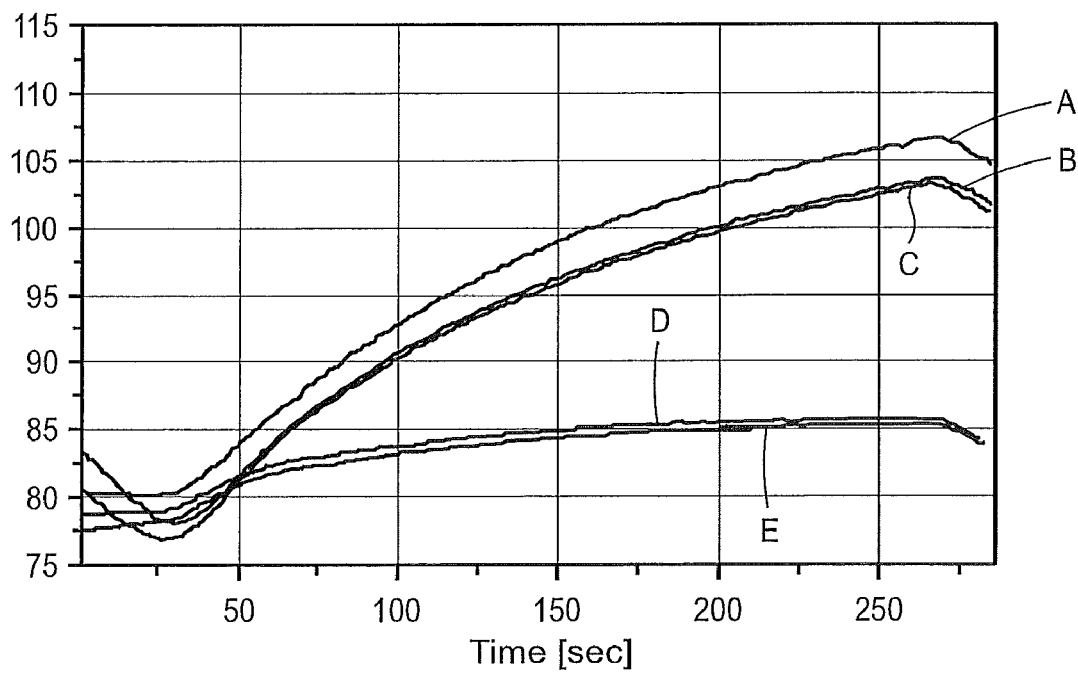
Figure 9A:
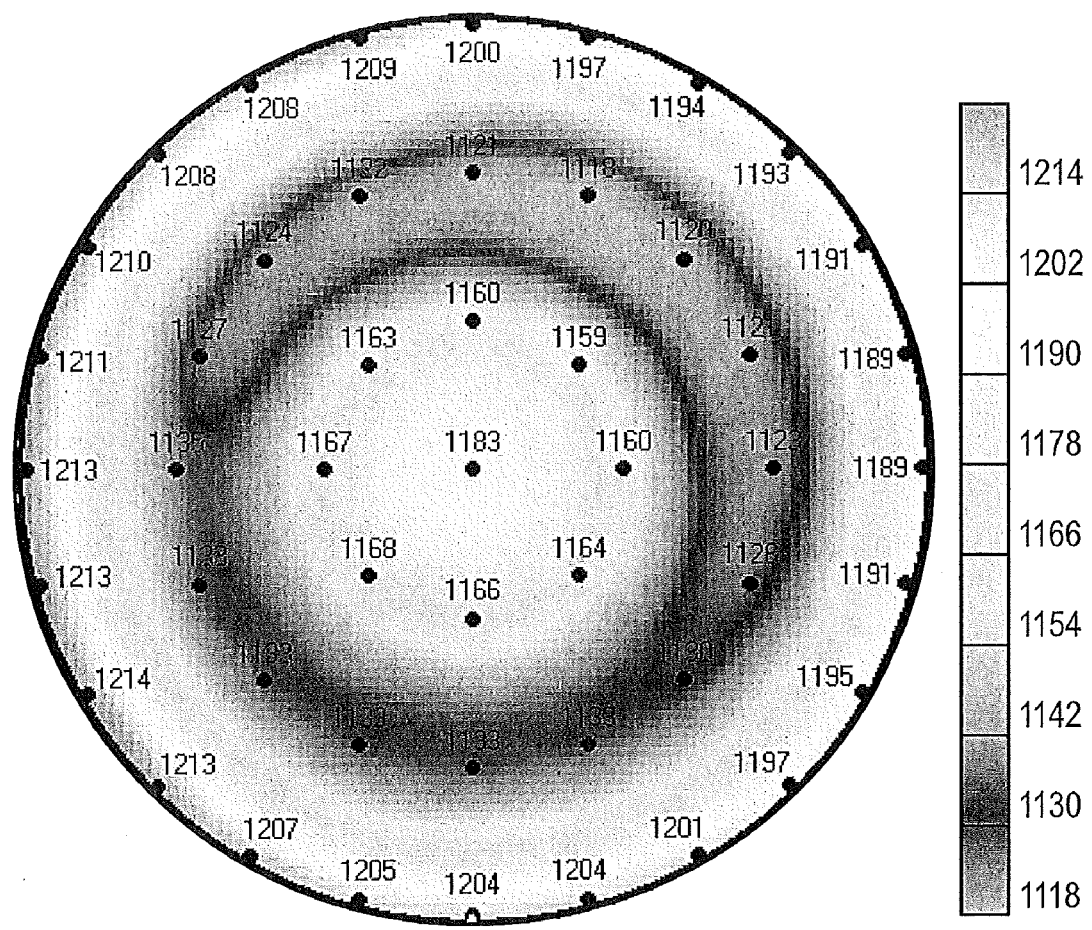
FIGS. 9A to 9D and 10A and 10D show etching rate profiles using an aluminum backing plate with a gasket material between the thermal control plates and backing plate (FIGS. 9A to 9D) and without a gasket material (FIGS. 10A to 10D).
Figure 9B:
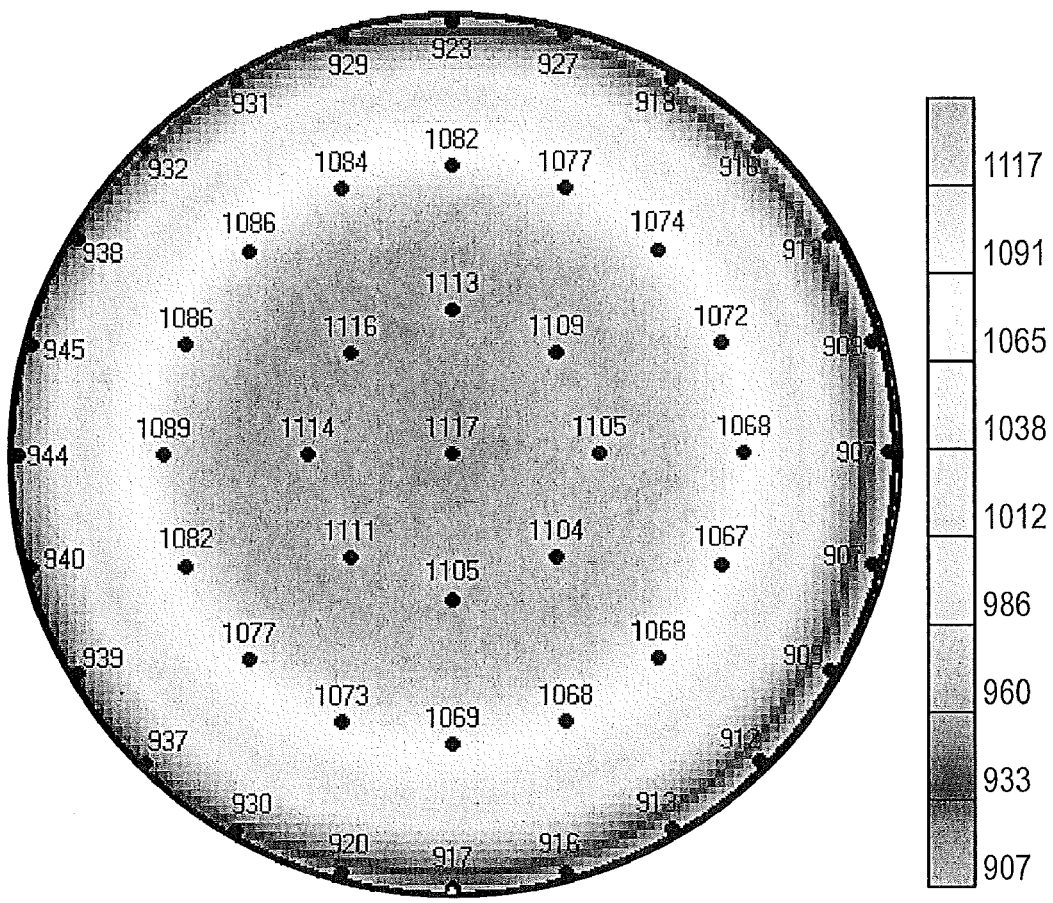
Figure 9C:
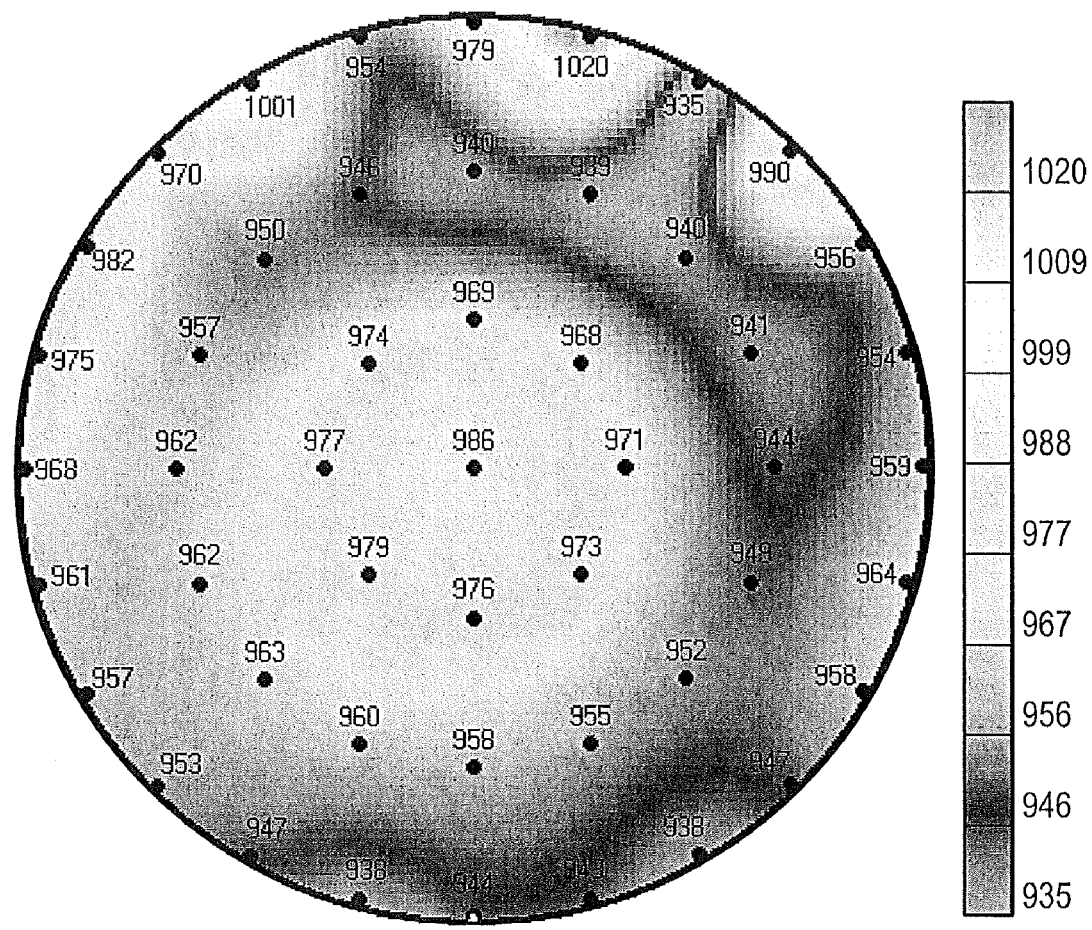
Figure 9D:
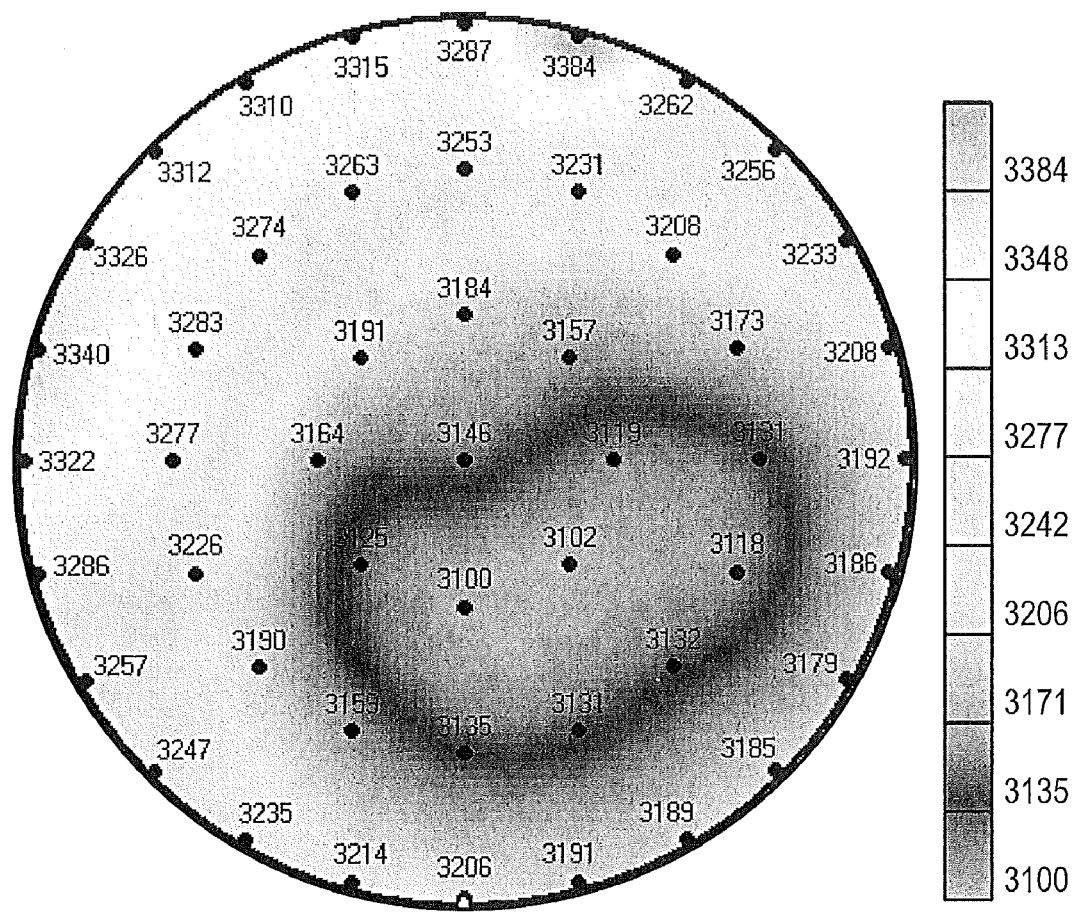
Figure 10A:
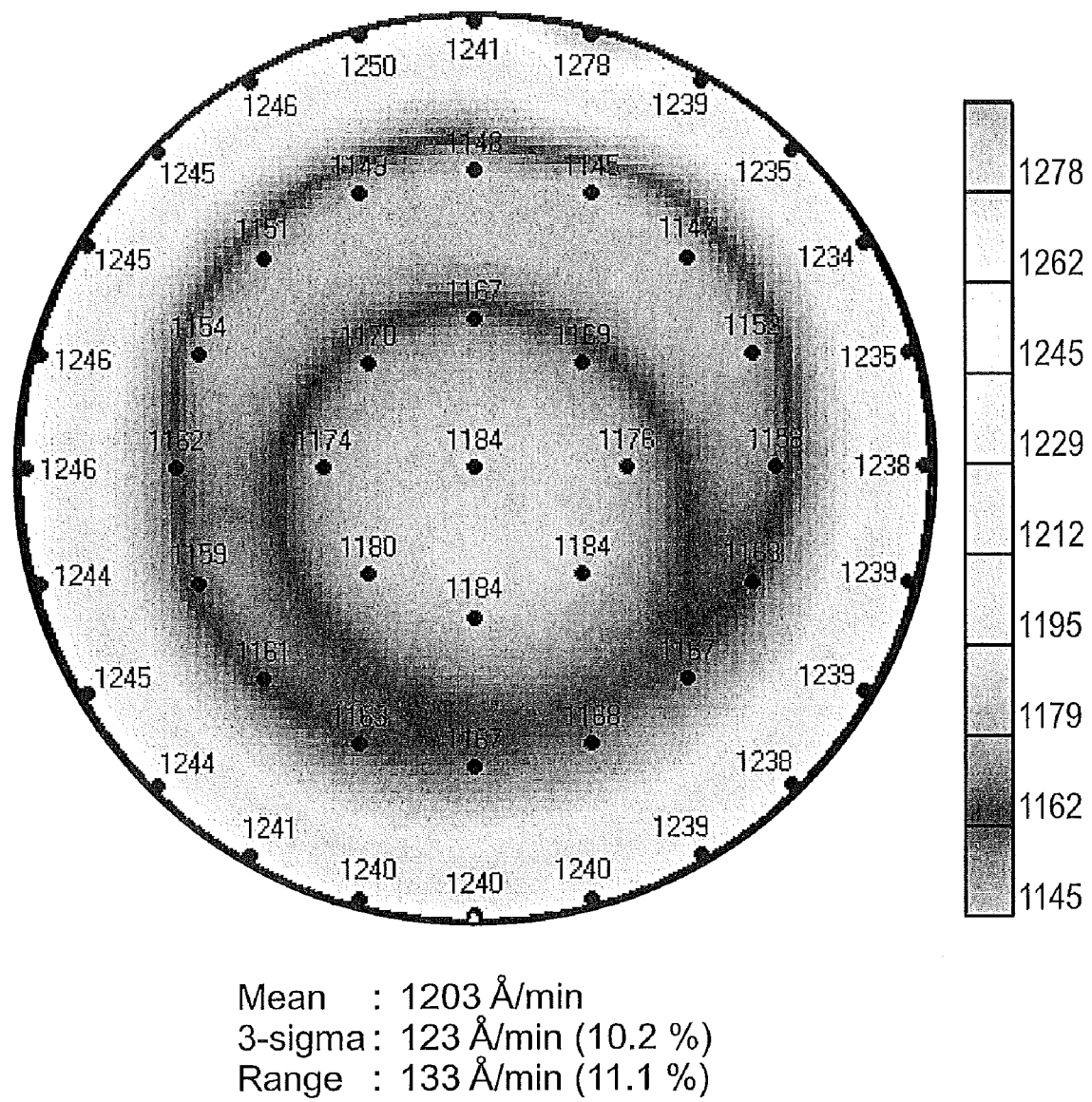
Figure 10B:
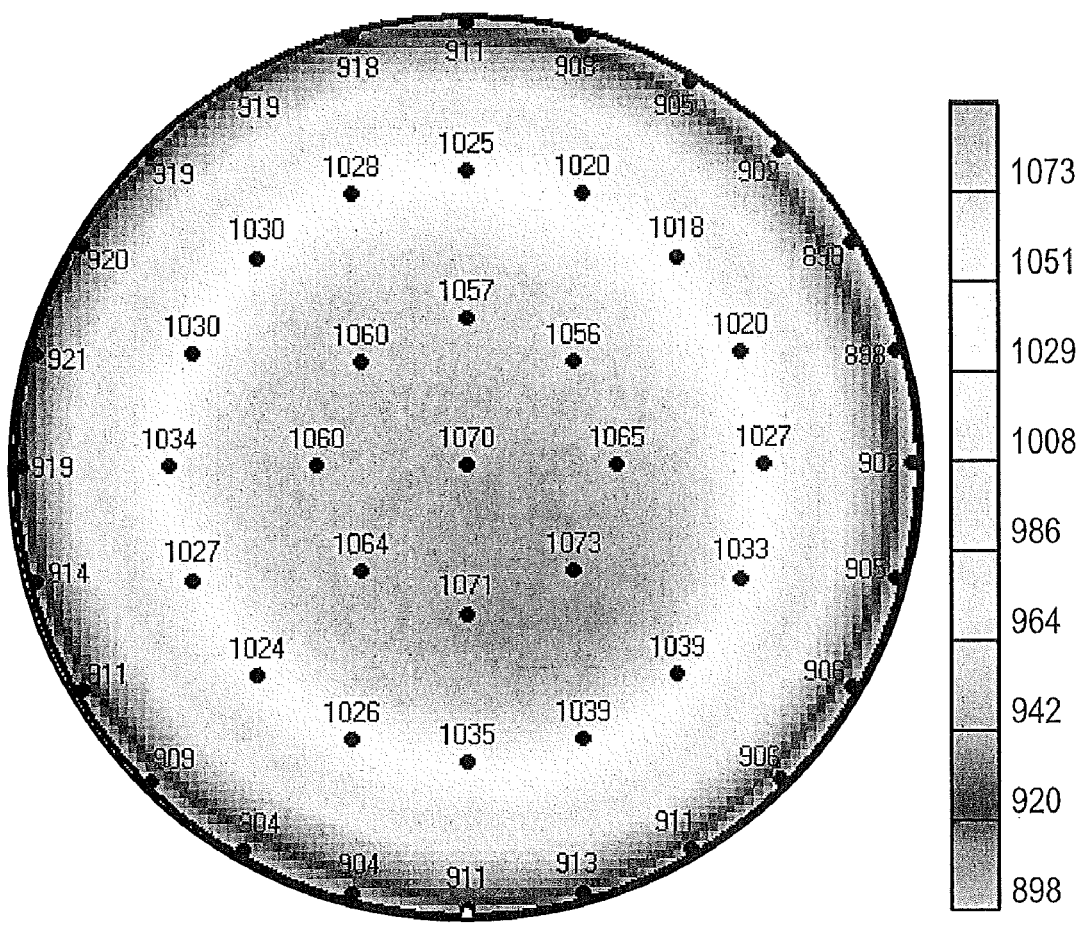
Figure 10C:
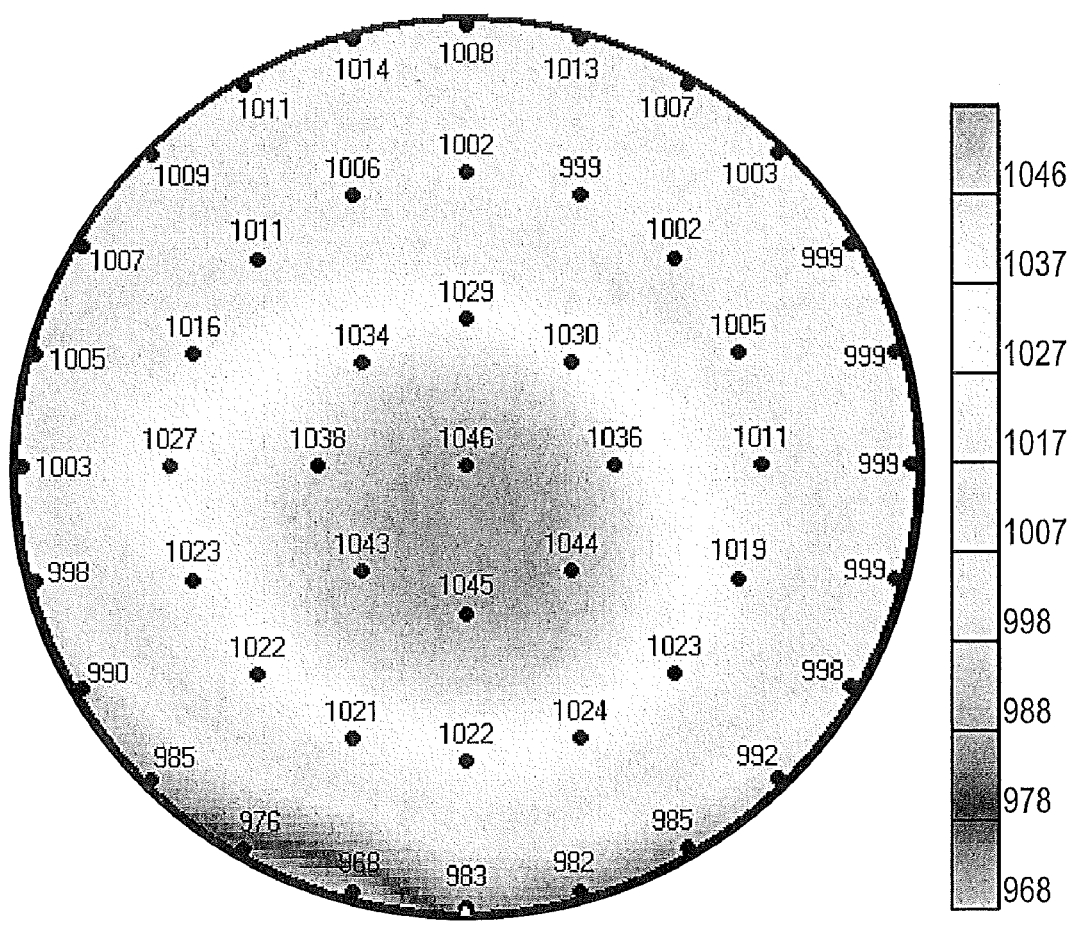
Figure 10D:
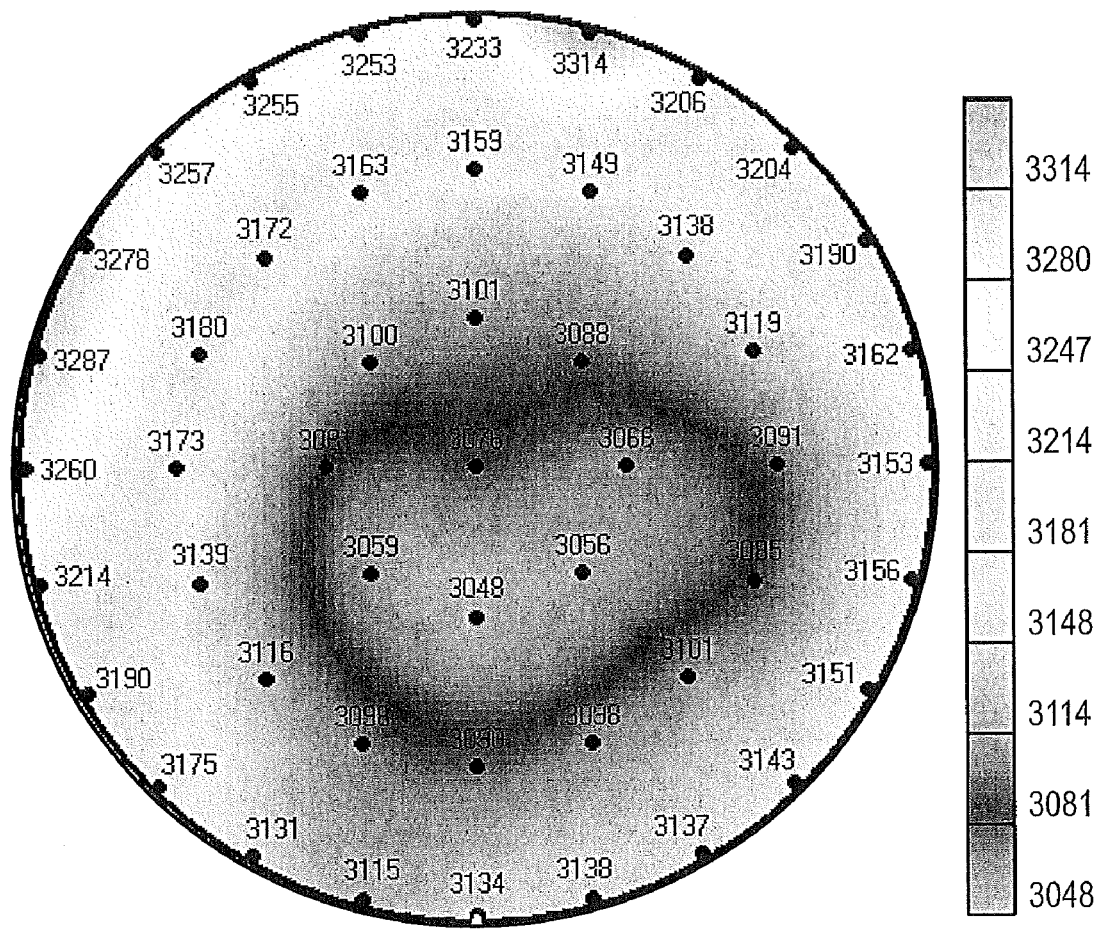

FIGS. 7 and 8 show test results demonstrating that the Q-Pad II composite material can improve thermal performance and minimize first wafer effects when placed between the top surface of an aluminum backing plate and a bottom surface of an annular projection of a thermal control plate. In FIG. 7, the relationship between backing plate temperature and time is shown for no gasket and for different gasket materials placed between the top surface of an aluminum backing plate and a bottom surface of an annular projection of a thermal control plate. Curve A is for a backing plate made of graphite and no gasket, curve B is for a backing plate made of aluminum and no gasket, and curve C is for a backing plate made of aluminum and a Q-Pad II composite gasket. In FIG. 8, curves A, B and C are for an aluminum backing plate and no gasket used, and curves D and E are for an aluminum backing plate and a Q-Pad II composite gasket. In FIG. 8, for curves A, B, C, the first wafer effect was 3° C., while in curves D and E, the first wafer effect was less than 0.5° C.

FIGS. 9A to 9D and 10A to 10D show etch rate profiles for process shift testing using an aluminum backing plate with a Q-Pad II composite gasket material between the thermal control plate and backing plate (FIGS. 9A to 9D) and without a gasket material (FIGS. 10A to 10D).

The compliant characteristics of the Q-Pad II composite gasket material surprisingly improved performance results by increasing thermal contact at contact surfaces (thermal and RF paths) between the thermal control plate and backing plate, as demonstrated by the test results shown in FIGS. 7 and 8, and FIGS. 9A to 9D and 10A to 10D.

Figure 11:
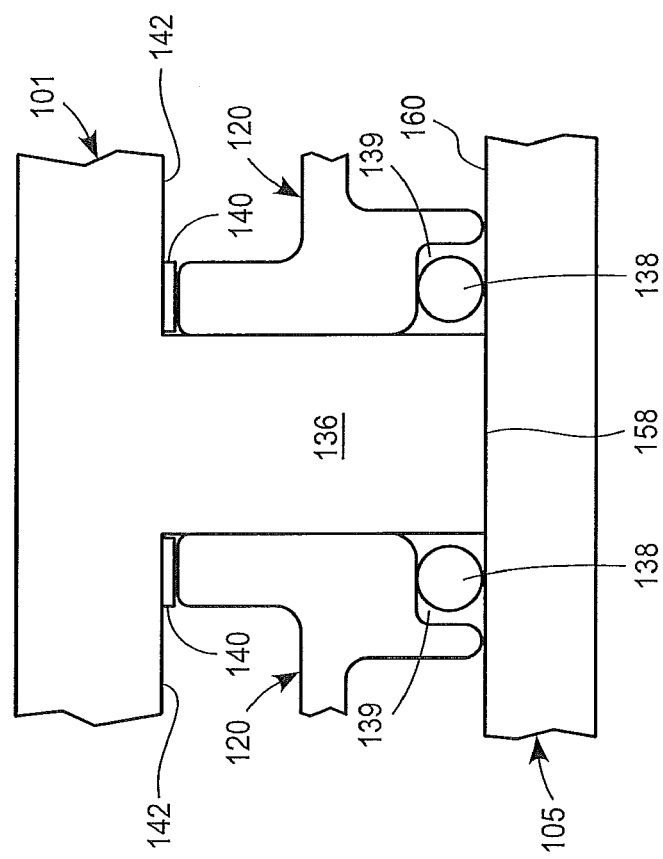
FIG. 11 is an enlarged view of a portion of a showerhead electrode assembly according to another embodiment.

FIG. 11 illustrates a portion of another embodiment of a showerhead electrode assembly. Referring to FIGS. 2 and 3, the embodiment shown in FIG. 11 does not include a backing member, and the thermal control plate 101 is secured directly to the inner electrode member 105. The showerhead electrode assembly shown in FIG. 11 can also include an optional outer electrode member, such as the outer electrode member 107 shown in FIG. 1. The outer electrode member can have a ring configuration comprised of a plurality of segments. The thermal control plate 101 can be secured directly to the inner electrode member 105 and optional outer electrode member in any suitable manner, such as by fasteners and/or adhesive bonding, such as elastomer bonding. As shown in FIG. 11, there is a contact point 158 between the top surface 160 of the inner electrode member 105 and the annular projection 136 of the thermal control plate 101. In the embodiment, the outer surface of the thermal control plate 101 can be anodized except at the surface at the contact point 158, which is of bare aluminum. Contact point 132 provides a thermal path to remove heat from the inner electrode member 105 and an RF path for RF power passing through the inner electrode member 105. Seals 138, such as O-rings, are disposed in offsets 139 between the aluminum baffle rings 120 and the top surface 160 to form a gas-tight seal. The upper ends of the vertical walls of the baffle rings 120 are separated from the bottom surface 142 of the thermal control plate 101 by shims 140. The shims 140 are typically made of a dielectric material, such as Kapton®.

Figure 12:
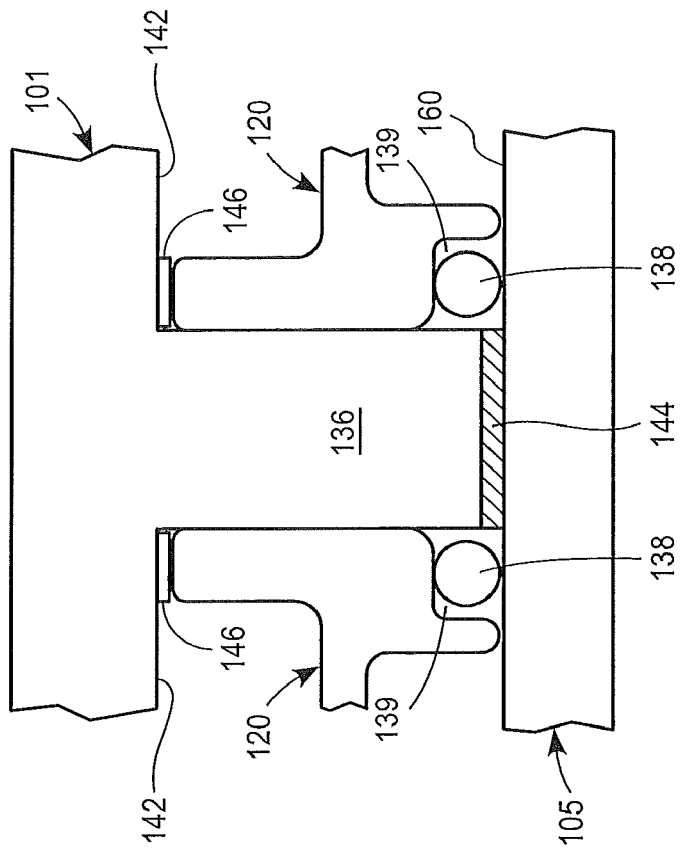
FIG. 12 illustrates the portion of the showerhead electrode assembly shown in FIG. 11 including an interface gasket.

FIG. 12 illustrates a modification to the showerhead electrode assembly shown in FIG. 11 to reduce the occurrence of galling between the thermal control plate 101 and the inner electrode member 105 (and also the optional outer electrode member) along contact points located between them, and consequently to also reduce problems associated with such galling, such as particle generation. For example, for a silicon electrode member, galling can cause silicon particle generation and aluminum particle generation. Particularly, as shown in FIG. 12, a gasket 144 is located between the bottom surface of the annular projection 136 of the thermal control plate 101 and the top surface 160 of the inner electrode member 105. The gasket 144 separates adjacent ones of the plenums formed in the thermal control plate 101 from each other.

The gasket 144 can be made of the same materials as the gaskets 144 described above with respect to the embodiment of the showerhead electrode assembly shown in FIGS. 3 and 4. The gasket 144 material is electrically and thermally conductive to provide electrical and thermal conduction between the thermal control plate 101 and the inner electrode member 105 (and optional outer electrode member), i.e., the gasket 144 provides an electrically-conductive thermal interface between the contact points.

As also shown in FIG. 12, shims 146 having about the same thickness as the gasket 144 are located between the aluminum baffle rings 120 and the bottom surface 142 of the thermal control plate 101. The shims 146 can be of a dielectric material.

While the invention has been described in detail with reference to specific embodiments thereof, it will be apparent to those skilled in the art that various changes and modifications can be made, and equivalents employed, without departing from the scope of the appended claims.

What is claimed is:

1. A method of controlling plasma etching, comprising:
supplying process gas to a plasma etching chamber through a showerhead electrode assembly comprising:
a showerhead electrode mounted in an interior of the plasma etching chamber and powered by radio frequency (RF) energy;
a backing plate attached to the showerhead electrode;
a thermal control plate attached to the backing plate via a plurality of fasteners at multiple contact points across the backing plate; and
at least one thermally and electrically conductive gasket separating the backing plate and the thermal control plate at the contact points, the process gas flowing into a gap between the showerhead electrode and a bottom electrode on which a semiconductor substrate is supported; and
etching a semiconductor substrate in the plasma etching chamber by applying RF power to the showerhead electrode and energizing the process gas into a plasma state, wherein the temperature of the showerhead electrode is controlled by the thermal control plate via enhanced thermal conduction through the at least one thermally and electrically conductive gasket.

2. The method of claim 1, wherein the contact points comprise spaced apart annular projections on a lower surface of the thermal control plate, the at least one thermally and electrically conductive gasket comprising a plurality of annular gaskets sized to cover the annular projections.

3. The method of claim 1, wherein the thermal control plate and the backing plate are of bare aluminum and the gasket is a laminate of metal and polymer materials.

4. The method of claim 1, wherein the showerhead electrode comprises an inner electrode and an outer electrode, and the inner electrode is a circular plate of single crystal silicon and the outer electrode is a ring electrode comprised of a plurality of segments of single crystal silicon.

5. The method of claim 1, wherein the thermally and electrically conductive gasket is free of silver, nickel and copper, and the contact points cover about 1% to about 30% of the surface area of the backing plate.

6. The method of claim 1, wherein
a power supply supplies power to a heater which heats the thermal control plate in thermal response to a temperature controller;
a fluid control supplies fluid to a temperature controlled top wall of the chamber in response to the temperature controller; and
a temperature sensor arrangement measures the temperature of one or more portions of the showerhead electrode and supplies information to the temperature controller.

7. The method of claim 1, further comprising the heating of the showerhead electrode at a temperature of at least about 80° C.

8. The method of claim 7, wherein the heating of the showerhead electrode comprises heating and maintaining at least a portion of the showerhead electrode at a temperature of at least about 100° C.

9. The method of claim 7, wherein the heating of the showerhead electrode comprises heating and maintaining at least a portion of the showerhead electrode at a temperature of at least about 180° C.

10. The method of claim 1, wherein the heating of the showerhead electrode occurs before the etching of the semiconductor substrate, and the etching comprises etching openings defined by a patterned photoresist in an oxide layer on the semiconductor substrate, the openings being defined by a patterned photoresist.

11. The method of claim 1, wherein:
the contact points comprise surfaces of spaced-apart annular projections provided on a lower surface of the thermal control plate, the contact points cover about 1% to about 30% of the surface area of the backing plate;
the at least one gasket comprises an annular gasket located between each of the annular projections and an upper surface of the electrode; and
the gaskets are composed of a laminate of metal and polymer materials free of silver, nickel and copper.

* * * * *